(12) United States Patent
Chow et al.

(10) Patent No.: US 8,084,849 B2
(45) Date of Patent: Dec. 27, 2011

(54) INTEGRATED CIRCUIT PACKAGE SYSTEM WITH OFFSET STACKING

(75) Inventors: Seng Guan Chow, Singapore (SG); Linda Pei Ee Chua, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 7 days.

(21) Appl. No.: 11/954,603

(22) Filed: Dec. 12, 2007

(65) Prior Publication Data
US 2009/0152692 A1 Jun. 18, 2009

(51) Int. Cl.
H01L 23/02 (2006.01)
H01L 23/34 (2006.01)
H01L 23/48 (2006.01)
H01L 23/52 (2006.01)
H01L 29/40 (2006.01)
H01L 23/28 (2006.01)

(52) U.S. Cl. ........ 257/678; 257/685; 257/686; 257/723; 257/724; 257/777; 257/787; 257/E23.151

(58) Field of Classification Search ................. 257/686, 257/777, 667, 668, 723, 778, 787, E23.129, 257/730, 678, 685, 725, 724, E23.151; 438/458; 361/735, 790
See application file for complete search history.

(56) References Cited

U.S. PATENT DOCUMENTS

| | | |
|---|---|---|
| 5,333,505 A | 8/1994 | Takahashi et al. |
| 5,373,189 A * | 12/1994 | Massit et al. ............ 257/686 |
| 5,950,070 A | 9/1999 | Razon et al. |
| 6,043,109 A | 3/2000 | Yang et al. |
| 6,239,496 B1 * | 5/2001 | Asada ............ 257/777 |
| 6,252,308 B1 | 6/2001 | Akram et al. |
| 6,268,654 B1 | 7/2001 | Glenn et al. |
| 6,291,884 B1 | 9/2001 | Glenn et al. |
| 6,340,846 B1 | 1/2002 | LoBianco et al. |
| 6,401,545 B1 | 6/2002 | Monk et al. |
| 6,492,726 B1 | 12/2002 | Quek et al. |
| 6,653,723 B2 | 11/2003 | Manansala |
| 6,727,579 B1 | 4/2004 | Eldridge et al. |
| 6,730,543 B2 | 5/2004 | Akram |
| 6,861,288 B2 * | 3/2005 | Shim et al. ............ 438/109 |
| 6,962,282 B2 | 11/2005 | Manansala |
| 6,995,448 B2 | 2/2006 | Lee et al. |
| 7,026,709 B2 | 4/2006 | Tsai et al. |
| 7,031,500 B1 | 4/2006 | Shinohara |
| 7,138,706 B2 | 11/2006 | Arai et al. |
| 7,187,067 B2 | 3/2007 | Weng et al. |
| 7,227,253 B2 | 6/2007 | Tsai et al. |
| 7,245,008 B2 | 7/2007 | Lee |
| 7,276,393 B2 | 10/2007 | Derderian et al. |
| 7,288,835 B2 * | 10/2007 | Yim et al. ............ 257/685 |
| 7,298,033 B2 | 11/2007 | Yoo |
| 7,309,913 B2 * | 12/2007 | Shim et al. ............ 257/686 |
| 7,391,105 B2 | 6/2008 | Yeom |
| 7,468,556 B2 | 12/2008 | Logan et al. |
| 7,504,284 B2 | 3/2009 | Ye et al. |

(Continued)

*Primary Examiner* — Davienne Monbleau
*Assistant Examiner* — Teresa M Arroyo
(74) *Attorney, Agent, or Firm* — Mikio Ishimaru

(57) ABSTRACT

An integrated circuit package system includes: providing an interposer having a bond pad and a contact pad; mounting the interposer in an offset location over a carrier with an exposed side of the interposer coplanar with an edge of the carrier; connecting an electrical interconnect between bond pad and the carrier; and forming a package encapsulation over the carrier and the electrical interconnect with both the contact pad and the exposed side of the interposer not covered.

20 Claims, 5 Drawing Sheets

U.S. PATENT DOCUMENTS

| | | |
|---|---|---|
| 7,521,790 B2 | 4/2009 | Tanida et al. |
| 7,535,086 B2 * | 5/2009 | Merilo et al. ................. 257/676 |
| 7,557,443 B2 | 7/2009 | Ye et al. |
| 7,589,408 B2 | 9/2009 | Weng et al. |
| 2002/0030261 A1 * | 3/2002 | Rolda et al. ................... 257/685 |
| 2004/0106229 A1 * | 6/2004 | Jiang et al. ................... 438/106 |
| 2004/0145039 A1 * | 7/2004 | Shim et al. ................... 257/678 |
| 2005/0090050 A1 * | 4/2005 | Shim et al. ................... 438/200 |
| 2005/0253241 A1 * | 11/2005 | Hall ............................... 257/686 |
| 2006/0014328 A1 | 1/2006 | Shimonaka et al. |
| 2006/0076690 A1 * | 4/2006 | Khandros et al. ............. 257/777 |
| 2006/0220256 A1 * | 10/2006 | Shim et al. ................... 257/777 |
| 2006/0244157 A1 | 11/2006 | Carson |
| 2006/0256525 A1 | 11/2006 | Shim et al. |
| 2007/0108581 A1 | 5/2007 | Shim et al. |
| 2007/0181990 A1 * | 8/2007 | Huang et al. ................... 257/686 |
| 2007/0190690 A1 * | 8/2007 | Chow et al. ................... 438/113 |
| 2007/0216010 A1 | 9/2007 | Yim et al. |
| 2007/0246815 A1 | 10/2007 | Lu et al. |
| 2007/0278696 A1 * | 12/2007 | Lu et al. ........................ 257/777 |
| 2008/0157325 A1 * | 7/2008 | Chow et al. ................... 257/686 |
| 2009/0085178 A1 * | 4/2009 | Ha et al. ........................ 257/666 |
| 2009/0152700 A1 | 6/2009 | Kuan et al. |
| 2009/0152706 A1 | 6/2009 | Kuan et al. |
| 2009/0155960 A1 | 6/2009 | Chow et al. |

* cited by examiner

INTEGRATED CIRCUIT PACKAGE SYSTEM WITH OFFSET STACKING

CROSS-REFERENCE TO RELATED APPLICATIONS

The present application contains subject matter related to concurrently filed U.S. patent application Ser. No. 11/954,601. The related application is assigned to STATS ChipPAC Ltd.

The present application also contains subject matter related to concurrently filed U.S. patent application Ser. No. 11/954,607. The related application is assigned to STATS ChipPAC Ltd.

The present application further contains subject matter related to concurrently filed U.S. patent application Ser. No. 11/954,613, now U.S. Pat. No. 7,781,261. The related application is assigned to STATS ChipPAC Ltd.

TECHNICAL FIELD

The present invention relates generally to an integrated circuit package system and more particularly to an integrated circuit package system with an encapsulation.

BACKGROUND ART

In order to interface an integrated circuit with other circuitry, it is common to mount it on a lead frame or substrate. Each integrated circuit has bonding pads that are individually connected to the substrate's contact or terminal pads using extremely fine gold or aluminum wires or conductive balls, such as solder balls. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact form factors, such as the physical size and shape of a packaged integrated circuit, and providing a significant increase in overall integrated circuit density.

However, integrated circuit density continues to be limited by the "real estate" available for mounting individual integrated circuits on a substrate. Even larger form factor systems, such as personal computers (PC's), compute servers, and storage servers, need more integrated circuits in the same or smaller "real estate". Particularly acute, the needs for portable personal electronics, such as cell phones, digital cameras, music players, personal digital assistants (PDA's), and location-based devices, have further driven the need for increased integrated circuit density.

This increased integrated circuit density has led to the development of multi-chip packages in which more than one integrated circuit can be packaged. Each package provides mechanical support for the individual integrated circuits and one or more layers of interconnect lines that enable the integrated circuits to be connected electrically to surrounding circuitry.

Current multi-chip packages, also commonly referred to as multi-chip modules, typically consist of a printed circuit board (PCB) substrate onto which a set of separate integrated circuit components are directly attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be pre-assembled before the integrated circuit and integrated circuit connections can be tested. Thus, when integrated circuits are mounted and connected in a multi-chip module, individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, vertically stacked integrated circuits in typical multi-chip packages can present problems beyond those of horizontally arranged integrated circuit packages, further complicating the manufacturing process. It is more difficult to test and thus determine the actual failure mode of the individual integrated circuits. Moreover, the substrate and integrated circuit are often damaged during assembly or testing, complicating the manufacturing process and increasing costs.

For both vertical and horizontal multi-chip packages, assembly of the multi-chip packages must have reliable electrical and mechanical attachments between the multiple integrated circuits, the stacked packaged integrated circuits, or a combination thereof. For example, the encapsulating process for forming the packaged integrated circuit may cause contamination, such as mold flash or bleed, impeding reliable attachments. Another example, for integrated circuit packages having a recess in the encapsulation, contoured mold chase are used to form the recess which increases the risk of mold flashes, damage to the package structure from contact with the contoured portion of the mold chase, and the manufacturing cost to design specific mold chase for the desired recess in the encapsulation.

Thus, a need still remains for an integrated circuit package system providing low cost manufacturing, improved yield, improved reliability, and greater flexibility to offer more functionality and fewer footprints on the printed circuit board. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing an interposer having a bond pad and a contact pad; mounting the interposer in an offset location over a carrier with an exposed side of the interposer coplanar with an edge of the carrier; connecting an electrical interconnect between bond pad and the carrier; and forming a package encapsulation over the carrier and the electrical interconnect with both the contact pad and the exposed side of the interposer not covered.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
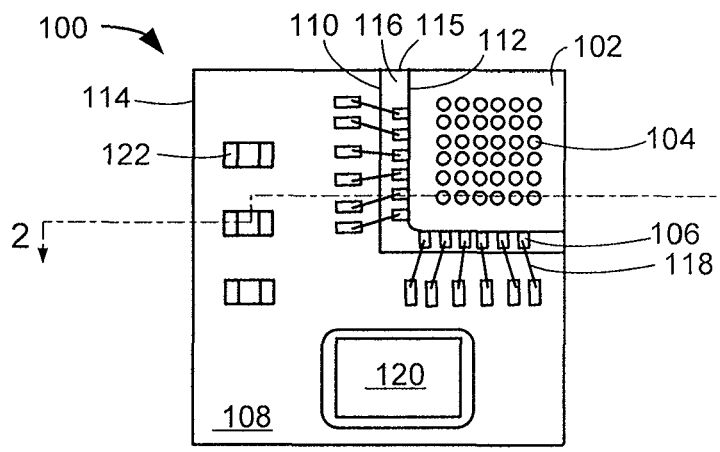
FIG. 1 is a top plan view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top plan view depicts the integrated circuit package system 100 without a cover. The top plan view depicts an interposer 102, such as substrate, having contact pads 104 and bond pads 106 over a carrier 108, such as a substrate. The bond pads 106 may be adjacent to non-exposed sides 110 of the interposer 102, wherein the non-exposed sides 110 are over an interior portion of the carrier 108. Exposed sides 112 of the interposer 102 are coplanar to edges 114 of the carrier 108. The interposer 102 is shown in an offset location over the carrier 108 and not in a central location over the carrier 108. The interposer 102 is at an upper right hand corner of the carrier 108.

The contact pads 104 are shown not covered by an anti-flash structure 116, such as non-conductive epoxy, sealant, polymeric material, wire lock resin material, or penetrable film adhesive, over a peripheral region adjacent to the non-exposed sides 110. Electrical interconnects 118, such as bond wires or ribbon bond wires, may connect between the bond pads 106 and the carrier 108. The anti-flash structure 116 covers the ends of the electrical interconnects 118 connected at the bond pads 106. The anti-flash structure 116 is optional. The anti-flash structure 116 is exposed at a peripheral side 115.

A first integrated circuit device 120, such as integrated circuit dice, packaged integrated circuit, or an interposer, mounts over the carrier 108. Passive devices 122, such as discrete resistors or capacitors, mount over the carrier 108. For illustrative purposes, the passive devices 122 are shown as the same type of components, although it is understood that the passive devices 122 may be different from each other. For example, the passive devices 122 may include different resistors, capacitors, inductors, or a combination thereof.

Figure 2:
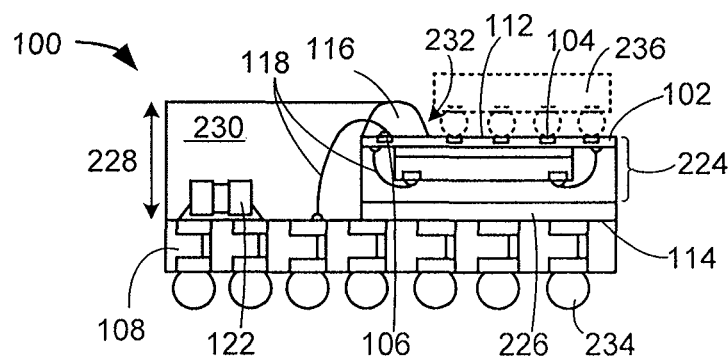
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts the passive devices 122 mounted over the carrier 108. A second integrated circuit device 224, such as a packaged integrated circuit, mounts over the carrier 108 with an adhesive 226.

The second integrated circuit device 224 includes the interposer 102 as its substrate. The second integrated circuit device 224 is shown in an offset location over the carrier 108. The exposed sides 112 of the interposer 102 are also the exposed sides of the second integrated circuit device 224. The exposed sides 112 of the second integrated circuit device 224 are coplanar with the edges 114 of the carrier 108. The electrical interconnects 118 may connect the bond pads 106 of the interposer 102 and the carrier 108. As an example, the second integrated circuit device 224 is shown in an inverted configuration with the interposer 102 facing away from the carrier 108.

The anti-flash structure 116 is over the peripheral region of the interposer 102 and a portion of the electrical interconnects 118 over the interposer 102. The anti-flash structure 116 and the second integrated circuit device 224 may determine an encapsulation height 228 of a package encapsulation 230 over the carrier 108. The anti-flash structure 116 is optional and if present may expose the contact pads 104 of the interposer 102. If the anti-flash structure 116 is not present, the package encapsulation 230 is over the electrical interconnects 118 connected with the bond pads 106 and may expose the contact pads 104. The anti-flash structure 116 can be exposed on the peripheral side 115 of the package encapsulation 230 in several different configurations. For example, the anti-flash structure 116 can be exposed on the peripheral side 115 on two adjacent sides, on opposite sides, on three sides, or on four sides.

The package encapsulation 230 is over the carrier 108 covering the first integrated circuit device 120 of FIG. 1, the passive devices 122, the second integrated circuit device 224, and the electrical interconnects 118. However, the encapsulation 230 does not cover the contact pads 104 on the top side of the interposer 102. The encapsulation 230 further does not cover a substantially vertical side of the interposer 102 that is coplanar with an edge of the carrier 108. The package encapsulation 230 may be adjacent to the anti-flash structure 116 forming an opening 232 which exposes the contact pads 104 of the interposer 102. External interconnects 234, such as solder balls, may attach to the bottom of the earner 108.

A mounting device 236, such as an integrated circuit or a passive component, may optionally mount over the integrated circuit package system 100 forming an integrated circuit package-on-package system. The mounting device 236 is depicted with dotted lines. The mounting device 236 may mount over the interposer 102 and within the opening 232.

It is understood that the first integrated circuit device 120 of FIG. 1, the second integrated circuit device 224, and the mounting device 236 shown in the embodiments are for illustrative purposes. The first integrated circuit device 120, the second integrated circuit device 224, and the mounting device 236 may be a wafer level chip scale package (WLCSP), redistributed line (RDL) die, array package, leadless package, leaded package, system-in-package (SiP), stacked die package, package-in-package (PiP), embedded die substrate, or thermally enhanced package, EMI shielded package.

Figure 3:
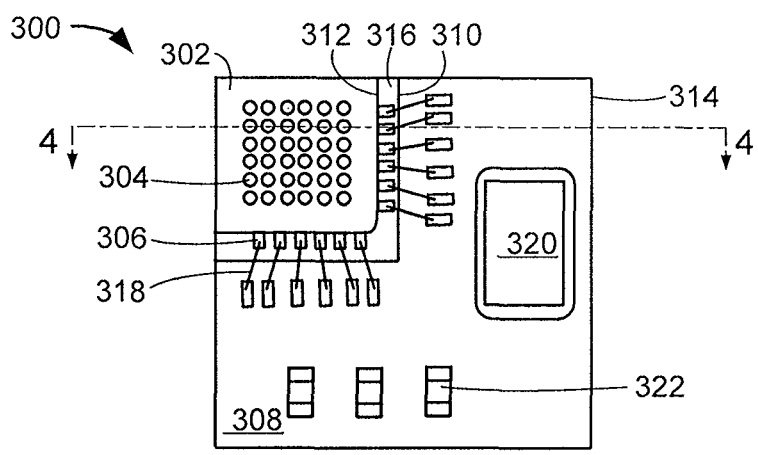
FIG. 3 is a top plan view of an integrated circuit package system in a second embodiment of the present invention.

Referring now to FIG. 3, therein is shown a top plan view of an integrated circuit package system 300 in a second embodiment of the present invention. The top plan view depicts an integrated circuit package system 300 without a cover. The integrated circuit package system 300 may be structurally similar to the integrated circuit package system 100 of FIG. 1 or may be the same as the integrated circuit package system 100 which is rotated 90° degrees counter-clock wise.

The top plan view depicts an interposer 302, such as substrate, having contact pads 304 and bond pads 306 over a carrier 308, such as a substrate. The bond pads 306 may be adjacent to non-exposed sides 310 of the interposer 302, wherein the non-exposed sides 310 are over an interior portion of the carrier 308. Exposed sides 312 of the interposer 302 are coplanar to edges 314 of the carrier 308. The interposer 302 is shown in an offset location over the carrier 308 and not in a central location over the carrier 308. The interposer 302 is at an upper left hand corner of the carrier 308.

The contact pads 304 are shown not covered by an anti-flash structure 316, such as non-conductive epoxy, sealant, polymeric material, wire lock resin material, or penetrable film adhesive, over a peripheral region adjacent to the non-exposed sides 310. Electrical interconnects 318, such as bond wires or ribbon bond wires, may connect between the bond pads 306 and the carrier 308. The anti-flash structure 316 covers the ends of the electrical interconnects 318 connected at the bond pads 306. The anti-flash structure 316 is optional.

A first integrated circuit device 320, such as integrated circuit dice, packaged integrated circuit, or an interposer, mounts over the carrier 308. Passive devices 322, such as discrete resistors or capacitors, mount over the carrier 308.

Figure 4:
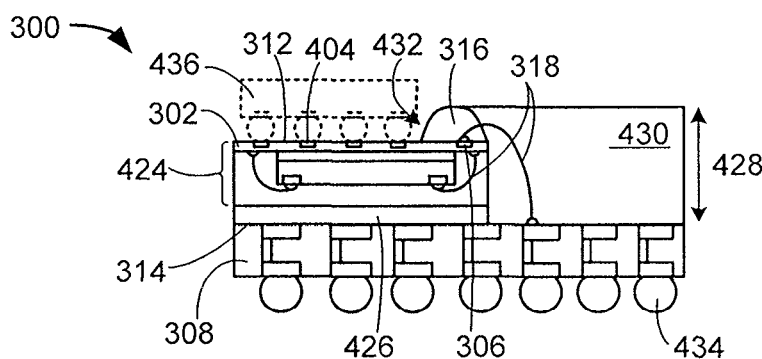
FIG. 4 is a cross-sectional view of the integrated circuit package system along line 4-4 of FIG. 3.

Referring now to FIG. 4, therein is shown a cross-sectional view of the integrated circuit package system 300 along line 4-4 of FIG. 3. The cross-sectional view depicts a second integrated circuit device 424, such as a packaged integrated circuit, mounted over the carrier 308 with an adhesive 426. The second integrated circuit device 424 includes the interposer 302 as its substrate. The second integrated circuit device 424 is shown in an offset location over the carrier 308. The exposed sides 312 of the interposer 302 are also the exposed sides of the second integrated circuit device 424. The exposed sides 312 of the second integrated circuit device 424 are coplanar with the edges 314 of the carrier 308. The electrical interconnects 318 may connect the bond pads 306 of the interposer 302 and the carrier 308. As an example, the second integrated circuit device 424 is shown in an inverted configuration with the interposer 302 facing away from the carrier 308.

The anti-flash structure 316 is over the peripheral region of the interposer 302 and a portion of the electrical interconnects 318 over the interposer 302. The anti-flash structure 316 and the second integrated circuit device 424 may determine an encapsulation height 428 of a package encapsulation 430 over the carrier 308. The anti-flash structure 316 is optional and if present may expose the contact pads 304 of the interposer 302. If the anti-flash structure 316 is not present, the package encapsulation 430 is over the electrical interconnects 318 connected with the bond pads 306 and may expose the contact pads 304.

The package encapsulation 430 is over the carrier 308 covering the first integrated circuit device 320 of FIG. 3, the passive devices 322 of FIG. 3, the second integrated circuit device 424, and the electrical interconnects 318. The package encapsulation 430 may be adjacent to the anti-flash structure 316 forming an opening 432 which exposes the contact pads 304 of the interposer 302. External interconnects 434, such as solder balls, may attach to the bottom of the carrier 308.

A mounting device 436, such as an integrated circuit or a passive component, may optionally mount over the integrated circuit package system 300 forming an integrated circuit package-on-package system. The mounting device 436 is depicted with dotted lines. The mounting device 436 may mount over the interposer 302 and within the opening 432.

Figure 5:
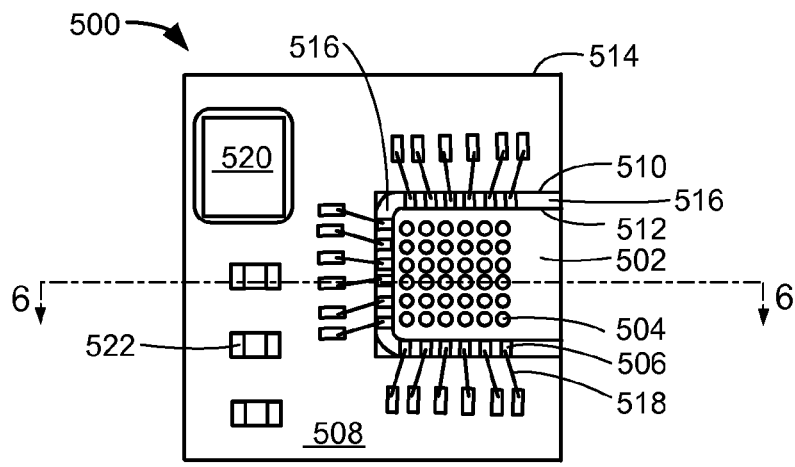
FIG. 5 is a top plan view of an integrated circuit package system in a third embodiment of the present invention.

Referring now to FIG. 5, therein is shown a top plan view of an integrated circuit package system 500 in a third embodiment of the present invention. The top plan view depicts the integrated circuit package system 500 without a cover. The top plan view depicts an interposer 502, such as substrate, having contact pads 504 and bond pads 506 over a carrier 508, such as a substrate. The bond pads 506 may be adjacent to non-exposed sides 510 of the interposer 502, wherein the non-exposed sides 510 are over an interior portion of the carrier 508. An exposed side 512 of the interposer 502 is coplanar to an edge 514 of the carrier 508. The interposer 502 is shown in an offset location over the carrier 508 and not in a central location over the carrier 508. The interposer 502 is at a right hand edge of the carrier 508.

The contact pads 504 are shown not covered by an anti-flash structure 516, such as non-conductive epoxy, sealant, polymeric material, wire lock resin material, or penetrable film adhesive, over a peripheral region adjacent to the non-exposed sides 510. Electrical interconnects 518, such as bond wires or ribbon bond wires, may connect between the bond pads 506 and the carrier 508. The anti-flash structure 516 covers the ends of the electrical interconnects 518 connected at the bond pads 506. The anti-flash structure 516 is optional.

A first integrated circuit device 520, such as integrated circuit dice, packaged integrated circuit, or an interposer, mounts over the carrier 508. Passive devices 522, such as discrete resistors or capacitors, mount over the carrier 508. For illustrative purposes, the passive devices 522 are shown as the same type of components, although it is understood that the passive devices 522 may be different from each other. For example, the passive devices 522 may include different resistors, capacitors, inductors, or a combination thereof.

Figure 6:
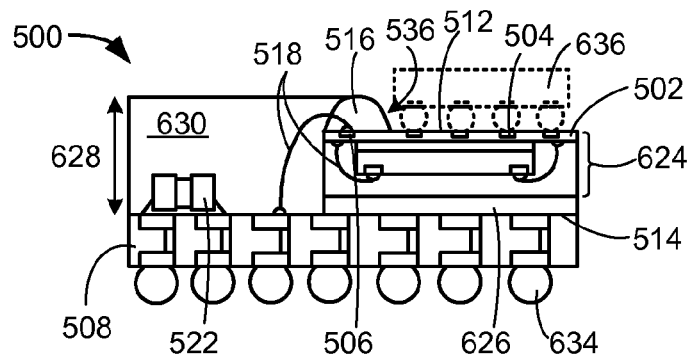
FIG. 6 is a cross-sectional view of the integrated circuit package system along line 6-6 of FIG. 5.

Referring now to FIG. 6, therein is shown a cross-sectional view of the integrated circuit package system 500 along line 6-6 of FIG. 5. The cross-sectional view depicts the passive devices 522 mounted over the carrier 508. A second integrated circuit device 624, such as a packaged integrated circuit, mounts over the carrier 508 with an adhesive 626.

The second integrated circuit device 624 includes the interposer 502 as its substrate. The second integrated circuit device 624 is shown in an offset location over the carrier 508. The exposed side 512 of the interposer 502 is also the exposed side of the second integrated circuit device 624. The exposed side 512 of the second integrated circuit device 624 is coplanar with the edge 514 of the carrier 508. The electrical interconnects 518 may connect the bond pads 506 of the interposer 502 and the carrier 508. As an example, the second integrated circuit device 624 is shown in an inverted configuration with the interposer 502 facing away from the carrier 508.

The anti-flash structure 516 is over the peripheral region of the interposer 502 and a portion of the electrical interconnects 518 over the interposer 502. The anti-flash structure 516 and the second integrated circuit device 624 may determine an encapsulation height 628 of a package encapsulation 630 over the carrier 508. The anti-flash structure 516 is optional and if present may expose the contact pads 504 of the interposer 502. If the anti-flash structure 516 is not present, the package encapsulation 630 is over the electrical interconnects 518 connected with the bond pads 506 and may expose the contact pads 504.

The package encapsulation 630 is over the carrier 508 covering the first integrated circuit device 520 of FIG. 5, the passive devices 522, the second integrated circuit device 624, and the electrical interconnects 518. The package encapsulation 630 may be adjacent to the anti-flash structure 516 forming an opening 632 which exposes the contact pads 504 of the interposer 502. External interconnects 634, such as solder balls, may attach to the bottom of the carrier 508.

A mounting device 636, such as an integrated circuit or a passive component, may optionally mount over the integrated circuit package system 500 forming an integrated circuit package-on-package system. The mounting device 636 is depicted with dotted lines. The mounting device 636 may mount over the interposer 502 and within the opening 632.

Figure 7:
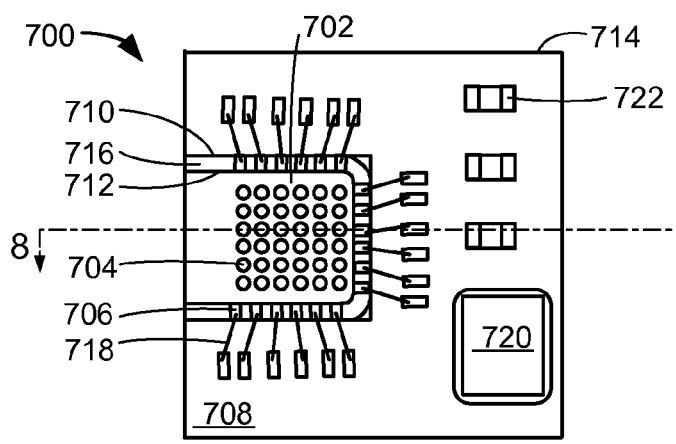
FIG. 7 is a top plan view of an integrated circuit package system in a fourth embodiment of the present invention.

Referring now to FIG. 7, therein is shown a top plan view of an integrated circuit package system 700 in a fourth embodiment of the present invention. The top plan view depicts the integrated circuit package system 700 without a cover. The integrated circuit package system 700 may be structurally similar to the integrated circuit package system 500 of FIG. 5 or may be the same as the integrated circuit package system 500 which is rotated 180° degrees.

The top plan view depicts an interposer 702, such as substrate, having contact pads 704 and bond pads 706 over a carrier 708, such as a substrate. The bond pads 706 may be adjacent to non-exposed sides 710 of the interposer 702, wherein the non-exposed sides 710 are over an interior portion of the carrier 708. An exposed side 712 of the interposer 702 is coplanar to an edge 714 of the carrier 708. The interposer 702 is shown in an offset location over the carrier 708 and not in a central location over the carrier 708. The interposer 702 is at the left hand edge of the carrier 708.

The contact pads 704 are shown not covered by an anti-flash structure 716, such as non-conductive epoxy, sealant, polymeric material, wire lock resin material, or penetrable film adhesive, over a peripheral region adjacent to the non-exposed sides 710. Electrical interconnects 718, such as bond wires or ribbon bond wires, may connect between the bond pads 706 and the carrier 708. The anti-flash structure 716 covers the ends of the electrical interconnects 718 connected at the bond pads 706. The anti-flash structure 716 is optional.

A first integrated circuit device 720, such as integrated circuit dice, packaged integrated circuit, or an interposer, mounts over the carrier 708. Passive devices 722, such as discrete resistors or capacitors, mount over the carrier 708.

Figure 8:
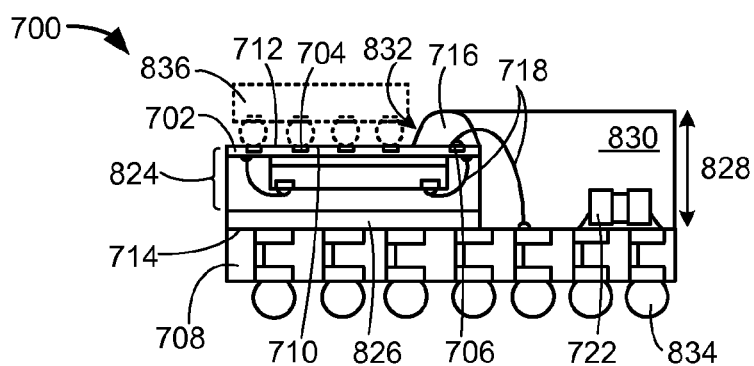
FIG. 8 is a cross-sectional view of the integrated circuit package system along line 8-8 of FIG. 7.

Referring now to FIG. 8, therein is shown a cross-sectional view of the integrated circuit package system 700 along line 8-8 of FIG. 7. The cross-sectional view depicts the passive devices 722 mounted over the carrier 708. A second integrated circuit device 824, such as a packaged integrated circuit, mounts over the carrier 708 with an adhesive 826.

The second integrated circuit device 824 includes the interposer 702 as its substrate. The second integrated circuit device 824 is shown in an offset location over the carrier 708. The exposed side 712 of the interposer 702 is also the exposed side of the second integrated circuit device 824. The exposed side 712 of the second integrated circuit device 824 is coplanar with the edge 714 of the carrier 708. The electrical interconnects 718 may connect the bond pads 706 of the interposer 702 and the carrier 708. As an example, the second integrated circuit device 824 is shown in an inverted configuration with the interposer 702 facing away from the carrier 708.

The anti-flash structure 716 is over the peripheral region of the interposer 702 and a portion of the electrical interconnects 718 over the interposer 702. The anti-flash structure 716 and the second integrated circuit device 824 may determine an encapsulation height 828 of a package encapsulation 830 over the carrier 708. The anti-flash structure 716 is optional and if present may expose the contact pads 704 of the interposer 702. If the anti-flash structure 716 is not present, the package encapsulation 830 is over the electrical interconnects 718 connected with the bond pads 706 and may expose the contact pads 704.

The package encapsulation 830 is over the carrier 708 covering the first integrated circuit device 720 of FIG. 7, the passive devices 722, the second integrated circuit device 824, and the electrical interconnects 718. The package encapsulation 830 may be adjacent to the anti-flash structure 716 forming an opening 832 which exposes the contact pads 704 of the interposer 702. External interconnects 834, such as solder balls, may attach to the bottom of the carrier 708.

A mounting device 836, such as an integrated circuit or a passive component, may optionally mount over the integrated circuit package system 700 forming an integrated circuit package-on-package system. The mounting device 836 is depicted with dotted lines. The mounting device 836 may mount over the interposer 702 and within the opening 832.

Figure 9:
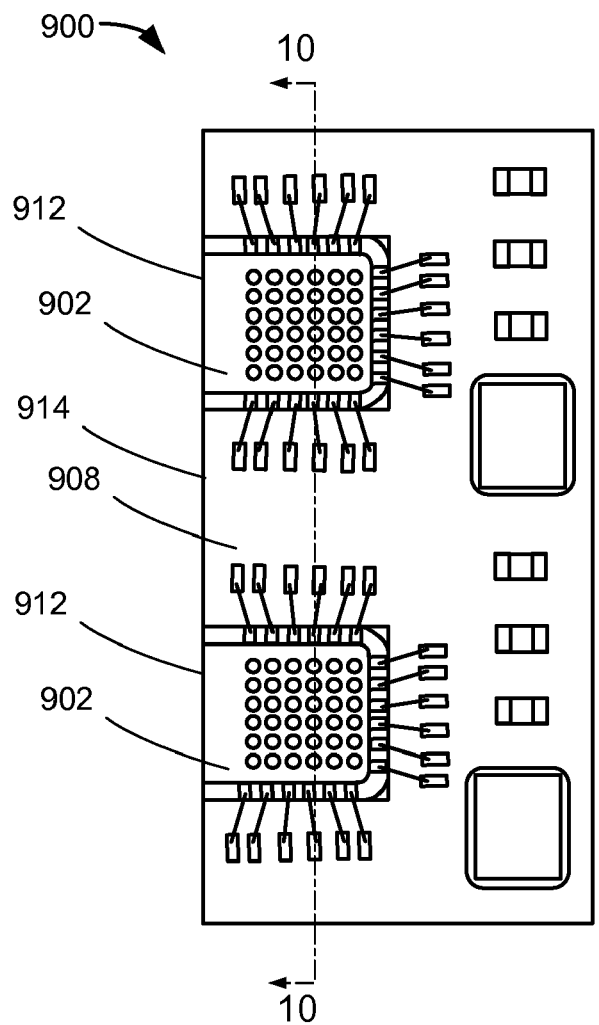
FIG. 9 is a top plan view of an integrated circuit package system in a fifth embodiment of the present invention.

Referring now to FIG. 9, therein is shown a top plan view of an integrated circuit package system 900 in a fifth embodiment of the present invention. The top plan view depicts the integrated circuit package system 900 without a cover. The integrated circuit package system 900 may be structurally similar to the integrated circuit package system 700 of FIG. 7 or may be the same as the integrated circuit package system 700. As a more specific example, the integrated circuit package system 900 may be two of the integrated circuit package system 700 side by side.

The integrated circuit package system 900 may include interposers 902 over a carrier 908. Each of the interposers 902 may include an exposed side 912 coplanar with an edge 914 of the carrier 908.

Figure 10:
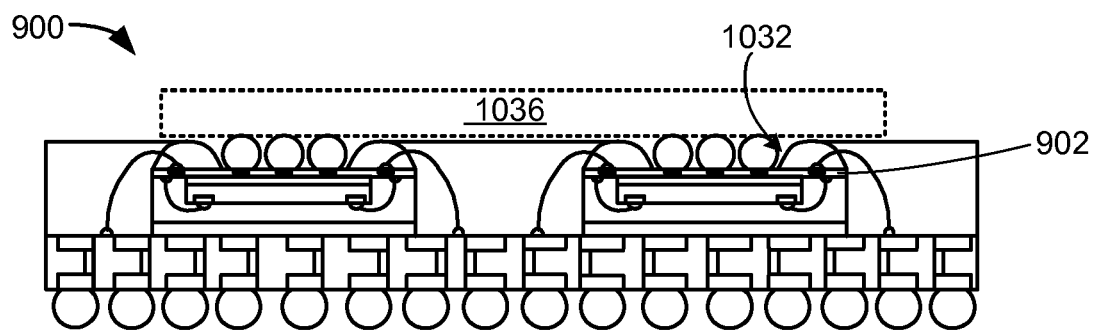
FIG. 10 is a cross-sectional view of the integrated circuit package system along line 10-10 of FIG. 9.

Referring now to FIG. 10, therein is shown a cross-sectional view of the integrated circuit package system 900 along line 10-10 of FIG. 9. The cross-sectional view depicts the integrated circuit package system 900 may be two of the integrated circuit package system 700 of FIG. 7 not separated or not singulated from each other.

A mounting device 1036, such as an integrated circuit or a passive component, may optionally mount over the integrated circuit package system 900 forming an integrated circuit package-on-package system. The mounting device 1036 is depicted with dotted lines. The mounting device 1036 may mount over the interposers 902 and within openings 1032 of the integrated circuit package system 900.

For illustrative purposes, the integrated circuit package system 900 is shown with two of the integrated circuit package system 700, although it is understood that the integrated circuit package system 900 may include different integrated circuit package systems. For example, the integrated circuit package system 900 may include the integrated circuit package system 700 and the integrated circuit package system 500 of FIG. 5, wherein the integrated circuit package system 700 differs from the integrated circuit package system 500.

Figure 11:
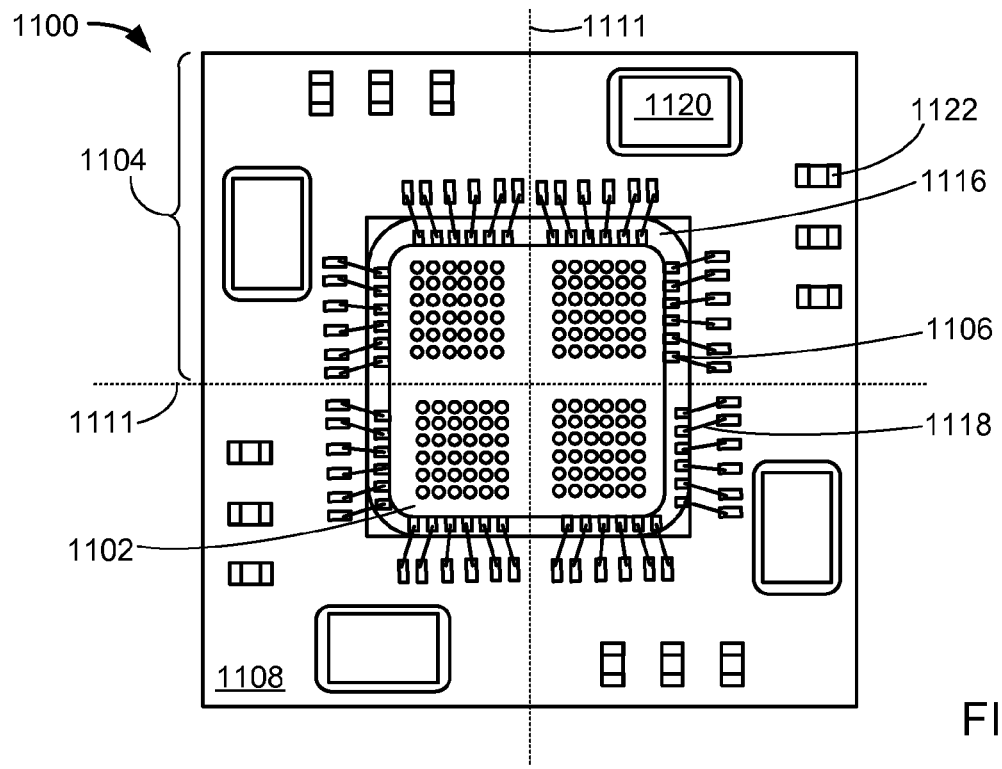
FIG. 11 is a top plan view of a first intermediate integrated circuit package system in an embodiment of the present invention.

Referring now to FIG. 11, therein is shown a top plan view of a first intermediate integrated circuit package system 1100 in an embodiment of the present invention. The top plan view depicts the first intermediate integrated circuit package system 1100 without a cover. The first intermediate integrated circuit package system 1100 includes a composite interposer 1102 over a composite carrier 1108. The composite interposer 1102 is in a central portion of the composite carrier 1108.

Electrical interconnects 1118, such as bond wires or ribbon bond wires, connect bond pads 1106 of the composite interposer 1102 and the composite carrier 1108. A ring of an anti-flash structure 1116 may be formed over a peripheral region of the composite interposer 1102 over the ends of the electrical interconnects 1118 connected to the bond pads 1106. Passive devices 1122 and first integrated circuit devices 1120 mount over the composite carrier 1108.

The first intermediate integrated circuit package system 1100 may be described and divided into quadrants. Dashed lines in the x-axis direction and the y-axis direction demark the first intermediate integrated circuit package system 1100 into quadrants. The dashed lines may also represent singulation lines 1111 for singulating the first intermediate integrated circuit package system 1100.

The lower left hand quadrant may include the integrated circuit package system 100 of FIG. 1. The lower right hand quadrant may include the integrated circuit package system 300 of FIG. 3. The upper right and left hand quadrants may each also include further integrated circuit package system 1104, wherein the further integrated circuit package system 1104 may be similar or the same as the integrated circuit package system 100 or the integrated circuit package system 300.

Figure 12:
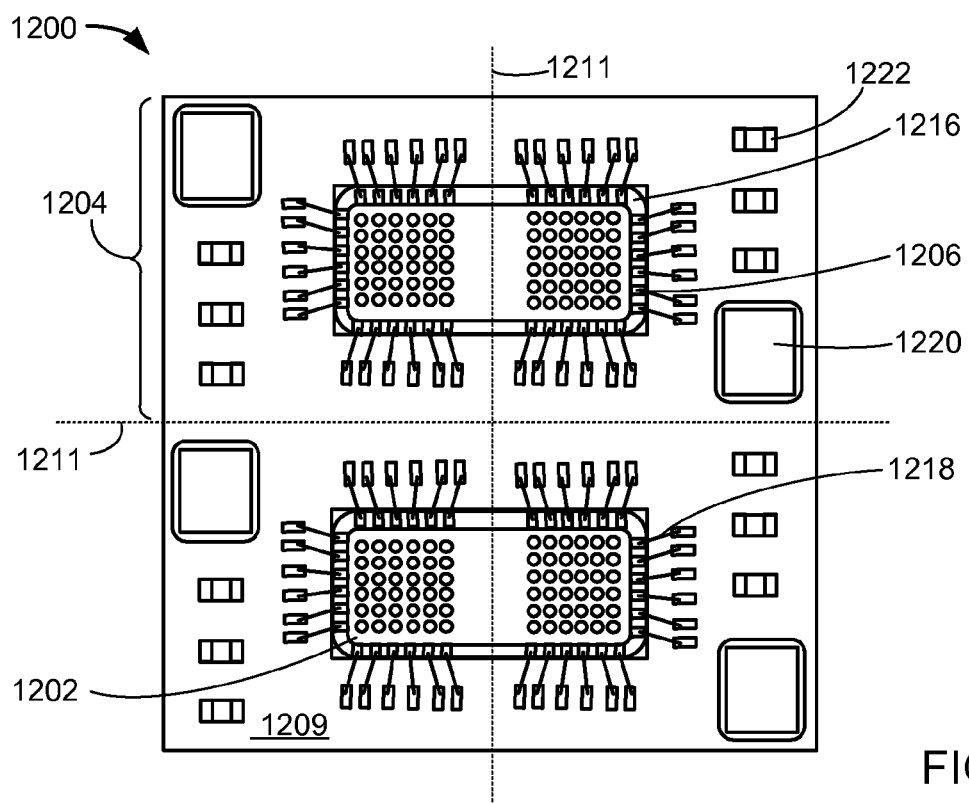
FIG. 12 is a top plan view of a second intermediate integrated circuit package system in an embodiment of the present invention.

Referring now to FIG. 12, therein is shown a top plan view of a second intermediate integrated circuit package system 1200 in an embodiment of the present invention. The top plan view depicts the second intermediate integrated circuit package system 1200 without a cover. The second intermediate integrated circuit package system 1200 includes composite interposers 1202 over a composite carrier 1208. The composite interposers 1202 are in a central portion of each upper half and lower half of the composite carrier 1208.

Electrical interconnects 1218, such as bond wires or ribbon bond wires, connect bond pads 1206 of the composite interposers 1202 and the composite carrier 1208. A ring of an anti-flash structure 1216 may be formed over a peripheral region of each of the composite interposers 1202 over the ends of the electrical interconnects 1218 connected to the bond pads 1206. Passive devices 1222 and first integrated circuit devices 1220 mount over the composite carrier 1208.

The second intermediate integrated circuit package system 1200 may be described and divided into quadrants. Dashed lines in the x-axis direction and the y-axis direction demark the second intermediate integrated circuit package system 1200 into quadrants. The dashed lines may also represent singulation lines 1211 for singulating the second intermediate integrated circuit package system 1200.

The lower left hand quadrant may include the integrated circuit package system 500 of FIG. 5. The lower right hand quadrant may include the integrated circuit package system 700 of FIG. 7. The upper right and left hand quadrants may each also include a further integrated circuit package system 1204, wherein the further integrated circuit package system 1204 may be similar or the same as the integrated circuit package system 500 or the integrated circuit package system 700.

Figure 13:
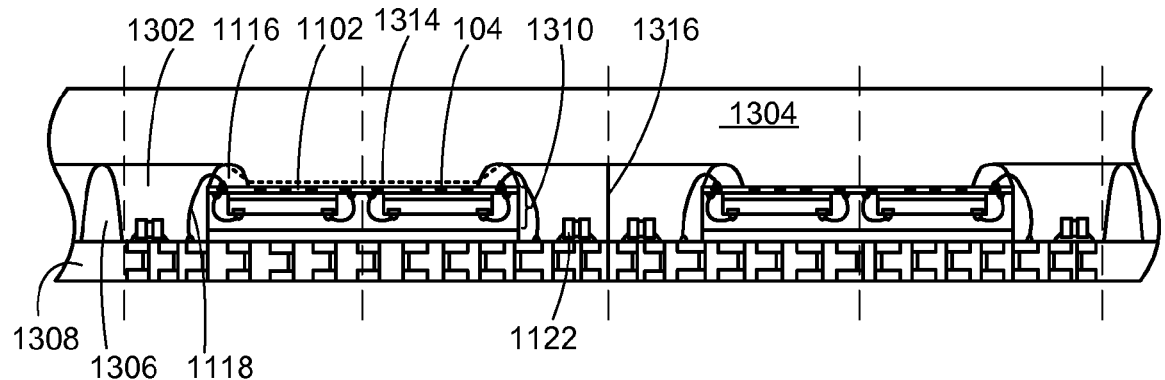
FIG. 13 is the structure of FIG. 11 in a step forming an encapsulation.

Referring now to FIG. 13, therein is shown the structure of FIG. 11 in a step forming an encapsulation 1302. A mold chase 1304, such as a planar or flat mold chase, may be over the anti-flash structure 1116. The mold chase 1304 may also be over a mold stop 1306, such as a stop of non-conductive epoxy, sealant, polymeric material, wire lock resin material, or penetrable film adhesive. The mold stop 1306 is optional. The anti-flash structure 1116, the mold stop 1306, or a combination thereof may cushion the force from the mold chase 1304 preventing damage to the composite interposer 1102. The anti-flash structure 1116 and the mold stop 1306 include resilient property compensating for coplanarity errors due to tilting in the assembly process of the integrated circuit package system 100.

The encapsulation 1302 is formed over a carrier strip 1308 covering the first integrated circuit devices 1120 of FIG. 11, the passive devices 1122, and composite second integrated circuit devices 1310 each including the composite interposer 1102. The anti-flash structure 1116 mitigates or eliminates mold flashing over the contact pads 104 of the composite interposer 1102.

As another example, the mold chase 1304 may be optional. The mold stop 1306 may function as a dam in a molding process, such as a dam-and-fill method, where liquid encapsulation process may be applied over the carrier strip 1308 covering the passive devices 1122, the composite second integrated circuit device structure 1310, and the electrical interconnects 1118. The anti-flash structure 1116 may also function as a dam in the molding process exposing the contact pads 104 of the composite interposer 1102.

The anti-flash structure 1116 may also be optional. If both the mold stop 1306 and the anti-flash structure 1116 are not present, the mold chase 1304 includes an extension 1314 depicted by dotted lines. The extension 1314 prevents the encapsulation 1302 from forming over the contact pads 104 of the composite interposer 1102.

The encapsulated structure may be singulated at dashed lines 1316 forming the integrated circuit package system 100 of FIG. 2 and the integrated circuit package system 300 of FIG. 4, as examples.

Figure 14:
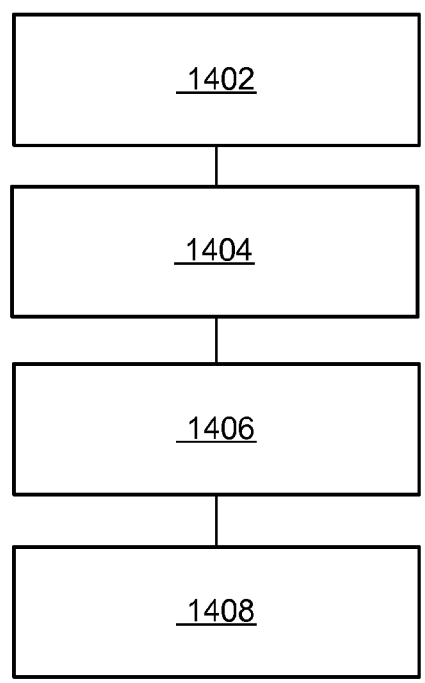
FIG. 14 is a flow chart of an integrated circuit package system for manufacturing of the integrated circuit package system in an embodiment of the present invention.

Referring now to FIG. 14, therein is shown a flow chart of an integrated circuit package system 1400 for manufacturing the integrated circuit package system 1400 in an embodiment of the present invention. The system 1400 includes providing an interposer having a bond pad and a contact pad in a block 1402; mounting the interposer in an offset location over a carrier with an exposed side of the interposer coplanar with an edge of the carrier in a block 1404; connecting an electrical interconnect between bond pad and the carrier in a block 1406; and forming a package encapsulation over the carrier and the electrical interconnect with both the contact pad and the exposed side of the interposer not covered in a block 1408.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing an interposer having a bond pad and a contact pad on a first side and further having a second side;
   mounting the interposer in an offset location over a carrier with the second side of the interposer coplanar with an edge of the carrier for mounting a mounting device thereover;
   connecting an electrical interconnect between bond pad and the carrier;
   forming an anti-flash structure over a portion of the electrical interconnect over the bond pad; and
   forming a package encapsulation over the carrier and the electrical interconnect with both the contact pad on the first side and the second side of the interposer not covered by the package encapsulation as well as the anti-flash structure being exposed at a peripheral side of the package encapsulation.

2. The method as claimed in claim 1 wherein mounting the interposer includes mounting a second integrated circuit device having the interposer.

3. The method as claimed in claim 1 wherein:
   providing the interposer includes:
      providing a composite interposer having the interposer; and
   mounting the interposer in the offset location over the carrier includes:
      mounting a composite interposer having the interposer over a composite carrier having the carrier.

4. The method as claimed in claim 1, wherein forming the anti-flash structure over a portion of the electrical interconnect over the bond pad includes exposing the anti-flash structure on two adjacent peripheral sides of the package encapsulation.

5. The method as claimed in claim 1 further comprising mounting a first integrated circuit device over the carrier.

6. A method for manufacturing an integrated circuit package system comprising:
   providing an interposer having a bond pad and a contact pad on a first side and further having a second side;
   mounting the interposer in an offset location over a carrier with the second side of the interposer coplanar with an edge of the carrier;
   mounting a first integrated circuit device over the carrier;
   mounting a passive device over the carrier;
   connecting an electrical interconnect between bond pad and the carrier;
   forming an anti-flash structure over a portion of the electrical interconnect over the bond pad; and
   forming a package encapsulation over the carrier, the electrical interconnect, the passive device, and the first integrated circuit device with both the contact pad on the first side and the second side of the interposer not covered by the package encapsulation as well as the anti-flash structure being exposed at a peripheral side of the package encapsulation.

7. The method as claimed in claim 6 wherein mounting the interposer includes mounting a second integrated circuit device having the interposer with the second side of the interposer on the same coplanar side of the second integrated circuit device.

8. The method as claimed in claim 6 wherein mounting the interposer in the offset location over the carrier with the second side of the interposer coplanar with the edge of the carrier includes mounting the interposer at a corner of the carrier with exposed sides of the interposer coplanar with edges of the carrier.

9. The method as claimed in claim 6 wherein mounting the interposer in the offset location over the carrier with the second side of the interposer coplanar with the edge of the carrier includes mounting interposers over the carrier with the second side of each of the interposers coplanar with edge of the carrier.

10. The method as claimed in claim 6 further comprising mounting a mounting device over the interposer.

11. An integrated circuit package system comprising:
   a carrier;
   an interposer, having a bond pad and a contact pad on a first side and further having a second side, and the interposer is in an offset location over the carrier with the second side of the interposer coplanar with an edge of the carrier for mounting a mounting device thereover;
   an anti-flash structure over a portion of the electrical interconnect over the bond pad; and
   an electrical interconnect between bond pad and the carrier;
   a package encapsulation over the carrier and the electrical interconnect with both the contact pad on the first side and the second side of the interposer not covered by the package encapsulation as well as the anti-flash structure being exposed at a peripheral side of the package encapsulation.

12. The system as claimed in claim 11 wherein the interposer is included in a second integrated circuit device.

13. The system as claimed in claim 11 wherein:
   the interposer is included in a composite interposer; and the carrier is included in a composite carrier having the composite interposer mounted thereover.

14. The system as claimed in claim 11, wherein the anti-flash structure over a portion of the electrical interconnect over the bond pad includes the anti-flash structure exposed on adjacent peripheral sides of the package encapsulation.

15. The system as claimed in claim 11 further comprising a first integrated circuit device over the carrier.

16. The system as claimed in claim 11 further comprising:
   a first integrated circuit device over the carrier;
   a passive device over the carrier; and
   wherein the package encapsulation is over the passive device and the first integrated circuit device.

17. The system as claimed in claim 16 wherein the interposer is included in a second integrated circuit device having the interposer with the second side of the interposer on the same coplanar side of the second integrated circuit device.

18. The system as claimed in claim 16 wherein the interposer is at a corner of the carrier with exposed sides of the interposer coplanar with edges of the carrier.

19. The system as claimed in claim 16 wherein the interposer includes interposers over the carrier with the second side of each of the interposers coplanar with edge of the carrier.

20. The system as claimed in claim 16 further comprising a mounting device over the interposer.

\* \* \* \* \*

UNITED STATES PATENT AND TRADEMARK OFFICE
CERTIFICATE OF CORRECTION

| | | |
|---|---|---|
| PATENT NO. | : 8,084,849 B2 | Page 1 of 1 |
| APPLICATION NO. | : 11/954603 | |
| DATED | : December 27, 2011 | |
| INVENTOR(S) | : Chow et al. | |

It is certified that error appears in the above-identified patent and that said Letters Patent is hereby corrected as shown below:

IN THE SPECIFICATIONS:
Column 5:
line 21, delete "bottom of the earner 108." and insert therefor --bottom of the carrier 108.--

IN THE CLAIMS:
Column 11:
claim 3, line 66, delete "mounting a composite" and insert therefor --mounting the composite--

Signed and Sealed this
Twenty-sixth Day of June, 2012

David J. Kappos
*Director of the United States Patent and Trademark Office*